United States Patent [19]

Higgs et al.

[11] 4,296,410
[45] Oct. 20, 1981

[54] TWO-STATE HALL ELEMENT PROXIMITY SENSOR DEVICE WITH LAMP INDICATOR

[75] Inventors: Jacob K. Higgs, Concord; Grant D. Avery, Loudon, both of N.H.

[73] Assignee: Sprague Electric Company, North Adams, Mass.

[21] Appl. No.: 124,389

[22] Filed: Feb. 25, 1980

[51] Int. Cl.³ .................. G08B 21/00; H01H 36/00; H01L 43/06
[52] U.S. Cl. .................. 340/686; 307/309; 323/368; 324/251; 338/32 H
[58] Field of Search .......... 340/686; 324/251; 323/89 H, 94 H, 368; 307/309; 338/32 H; 361/376

[56] References Cited

U.S. PATENT DOCUMENTS

| | | | |
|---|---|---|---|
| 3,419,798 | 12/1968 | Walton | 324/251 |
| 3,454,869 | 7/1969 | Strauss et al. | 340/686 X |
| 3,473,109 | 10/1969 | Maaz et al. | 340/686 X |
| 3,596,114 | 7/1971 | Maupin et al. | 307/309 X |
| 3,816,766 | 6/1974 | Anselmo et al. | 307/309 X |
| 4,090,091 | 5/1978 | Brown et al. | 340/686 X |
| 4,156,820 | 5/1979 | Fukuda et al. | 307/309 |
| 4,188,605 | 2/1980 | Stout | 338/32 H |

*Primary Examiner*—John W. Caldwell, Sr.
*Assistant Examiner*—Joseph E. Nowicki
*Attorney, Agent, or Firm*—Connolly and Hutz

[57] ABSTRACT

An integrated circuit including a Hall element and a threshold detector is encased in a plastic housing with the plane of the Hall element parallel with a face of the housing, providing a two-state Hall element proximity sensor. A light emitting diode (L.E.D.) is mounted in the housing and is connected to the output of the detector, providing visual indication of the state of the sensor. A kit includes the sensor and a compatible magnet to provide to users of little skill, proximity sensor parts that are easily assembled and made immediately effective in use.

6 Claims, 4 Drawing Figures

U.S. Patent    Oct. 20, 1981    4,296,410
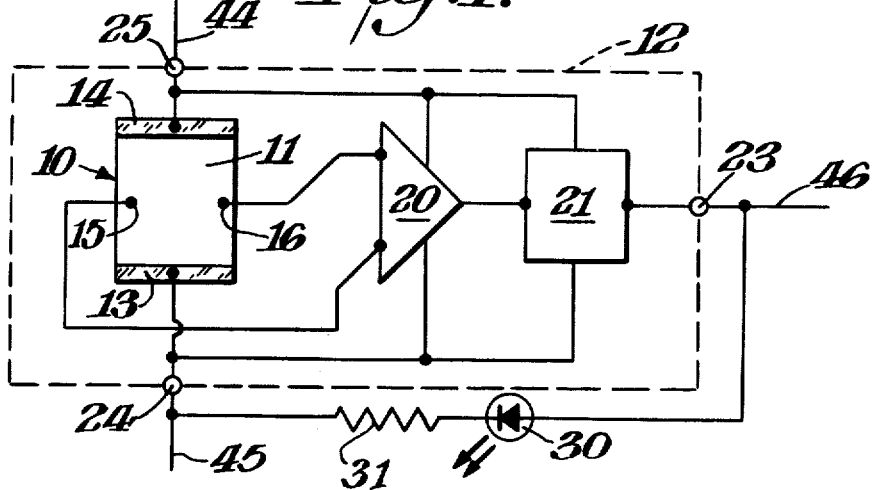
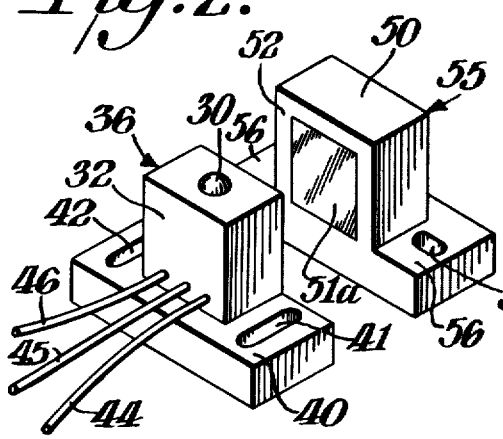
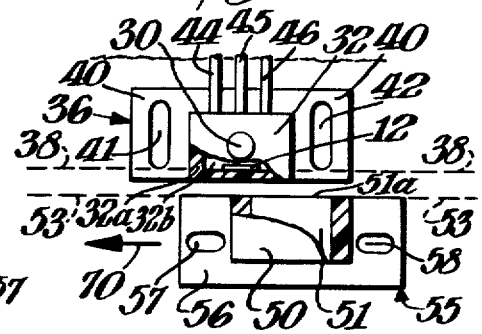
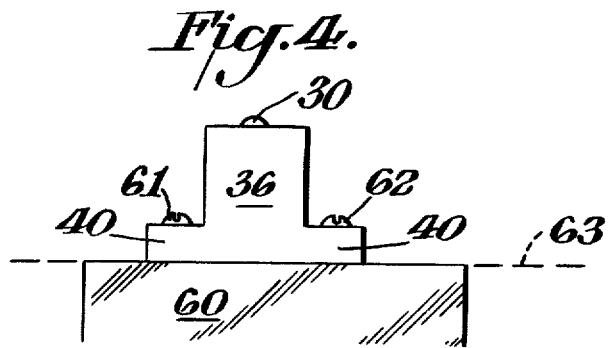

TWO-STATE HALL ELEMENT PROXIMITY SENSOR DEVICE WITH LAMP INDICATOR

BACKGROUND OF THE INVENTION

This invention relates to two-state Hall element sensors and more particularly to such sensors providing visual indication of their state. Two-state Hall element sensor devices are commercially available and are used as proximity sensors in manufacturing machinery, safety interlocks and intrusion alarm systems. Such two-state sensors are sometimes referred to as Hall element switches, because they provide an electrical output signal only when the ambient magentic field exceeds a predetermined value.

From one to many such sensor devices are employed in various manufacturing equipment and other complex systems. It is common practice to use a magnet in conjunction with the sensors, the magnet being mounted to a moving object relative to the sensor device, so that when the magnet is within a predetermined range of the sensor device, the Hall element sensor device changes state and produces an electrical signal. The electrical signal is connected to other devices in the system, e.g., for counting the magnet pass-bys, for actuating an alarm or for activating work stations along a production parts conveyor.

The installation, routine periodic adjustment and trouble shooting of the sensors in the system requires the use of special test equipment, or reliance on the responding devices of the system to be actuated by each sensor, to determine under various conditions of sensor device mounting, position of magnets, and electrical power supply, which of the two sensor states exist. These procedures are often inconvenient and time consuming.

It is an object of the present invention to provide in a two-state Hall element proximity sensor device a visual means for indicating at any time which of the two states exists, toward making installation, routine use, and maintenance of the device more efficient, reliable and convenient.

SUMMARY OF THE INVENTION

A two-state Hall-cell or Hall-element proximity sensor device includes a Hall element, a voltage-threshold detector means for generating a particular electrical signal only when the magnetic field sensed by the Hall element exceeds a predetermined magnitude, an indicator lamp connected to the output of the detector, and a housing containing the Hall element, the detector and the lamp.

Thus the lamp provides a visual indication at the point of use whether the magnetic field exceeds the aforesaid magnitude.

Also a kit is described that includes the Hall element proximity sensor and a magnet, which have predetermined magnetic field sensitivity and predetermined magnetic field generating characteristics, respectively.

This invention recognizes the fact that domestic maintenance personnel and even industrial engineers and technicians are rarely required to deal quantitatively with magnetic fields and thus for the most part are minus the experience to choose a magnetic field sensor and an appropriate magnet for use therewith. These components are usually specified in such terms as magnetic field sensitivity and magnetic field strength at various distances and orientations relative to their physical features and positions.

The indicator lamp means, that is a feature of the Hall element sensor of this invention, makes it more easily and conveniently possible to experimentally determine workable combinations of sensor, magnet and their relative mounting positions in a machine or system. In addition, the kit of this invention, includes a sensor having a predetermined sensitivity and a magnet of predetermined field generating properties such that the combination need not be specified in magnetic field terms but may rather be described in terms of the relative distances and spacial arrangements which are directly pertinent to the function for which they are intended. The sensor of the present invention is simple to use and thus effective use may be made of it by any of a large number of people having limited technical skill.

BRIEF DESCRIPTION OF THE DRAWINGS

FIG. 1 shows a diagram of a two-state proximity sensor device of this invention.

FIG. 2 shows in perspective view a proximity sensor kit of this invention including a magnetic field sensor device and a packaged magnet.

FIG. 3 shows in a top view the sensor device and magnet of FIG. 2 having relative positions as may typically occur when they are mounted to two members, respectively, of a mechanical system which members (not shown) experience relative motion therebetween.

FIG. 4 shows in front face view the sensor device of FIG. 3 being mounted to a fixed member of a machine.

DESCRIPTION OF THE PREFERRED EMBODIMENTS

The Hall element 10 in FIG. 1 includes a Hall element body 11, that is an isolated portion of a silicon semiconductor chip 12, and has two broad exitation electrodes 13 and 14 at opposite ends thereof. Two sensing electrodes 15 and 16 lie in one axis that is at right angles to the axis of the exitation electrodes 13 and 14. These two axes lie in the plane of the Hall element body 11 (i.e. in the plane of the paper as shown in FIG. 1).

The periphery of the semiconductor chip 12 is represented in FIG. 1 by a broken line, and other portions of the chip 12 are occupied by a differential amplifier 20 and a Schmitt trigger circuit 21. The Hall voltage generated at electrodes 15 and 16 is amplified by the amplifier 20. The Schmitt trigger circuit 21 is a switch that produces an electrical signal at the output terminal 23 when the amplified Hall element voltage exceeds a predetermined magnitude or threshold. Taken together the amplifier 20 and Schmitt trigger circuit 21 may be considered to be a threshold detector. DC voltage may be applied to the chip via terminals 24 and 25 and electrical energy is thereby supplied to the Hall element 10, amplifier 20 and Schmitt trigger 21. Access to the output voltage is available between terminals 23 and 24 or between terminals 23 and 25. A more detailed description of an integrated circuit of this kind is provided in the patent to Genesi, U.S. Pat. No. 3,816,766 issued June 11, 1974 and is incorporated by reference herein.

A light emitting diode 30 is connected across the output terminal pair 23 and 24 in such a polarity that a positive output voltage at terminal 23 will forward bias and illuminate the L.E.D. 30. Referring to the integrated circuit in FIG. 6 of the aforementioned Genesi patent, the particular signal at the output terminal (corresponding to terminal 23 herein) is about at the positive power supply voltage level (corresponding herein to the voltage that may be applied to terminal 25). This state or condition exists when the magnitude of the magnetic field (more precisely the magnitude of the orthogonal portion of the field) is zero, or less than that required to "switch" the threshold detector. A higher field causes the threshold detector to switch and to provide at the output terminal (corresponding to terminal 23 herein) to a near zero voltage. With this integrated circuit employed in applicant's invention, the L.E.D. 30 will be illuminated for fields below the threshold field and extinguished at fields above it. Other particular output signals (than near zero) may be provided during the periods that the magnetic field is greater than a given threshold value, using well known circuit techniques. For example, for the large magnetic field state, the voltage may be high instead of low, and the L.E.D. will then illuminate for the high field and extinguish for the low field conditions. Alternatively the output signal may be caused to pulsate during high field condition. The L.E.D. 30 is mounted at an outer surface of the housing 32 that contains the semiconductor chip 12 as is illustrated in FIGS. 2 and 3. Of course, other kinds of lamp than an L.E.D. may be used, e.g., a small incandescent bulb or a neon lamp. An L.E.D. is preferred because of its small size, low cost, small power dissipation and low voltage requirement that is compatible with integrated circuitry. The integrated circuit chips may also include a voltage regulator circuit, e.g., as disclosed in the above noted Genesi patent, for stabilizing the supply voltage to the Hall element 10, amplifier 20 and threshold detector circuit 21. Further, the threshold detector 21 may include an output amplifier stage, preferably of the switching type to provide circuit isolation between the load to be connected to terminal 23 and the Schmitt trigger circuit, and to provide output signal amplification. The term output signal as used herein is meant to include the output impedance of a transistor switch that is rendered on and off in response to the two states, respectively, of the Schmitt trigger circuit. Resistor 31 limits the current in L.E.D. 30.

The sensor device housing 32 is shown partially broken away in FIG. 3 revealing a portion of the wall 32a, an interior cavity 32b and a portion of the integrated circuit chip 12 being contained therein. The plane of the Hall element 10 seen in edge view is indicated by a broken line 38.

A flange 40 is integral with the housing 32 and has two elongated holes 41 and 42 by which the sensor device 36 may be adjustably mounted, e.g. by screws or machine bolts to the edge of a machine member or to a door jamb and the like. Flexible wire leads 44, 45 and 46 extend from a back surface (upper surface as shown in FIG. 3) being connected to the chip 12 as indicated in FIG. 1. The housing 32 is preferably an injection molded plastic part in which the chip 12 and L.E.D. 30 are mounted. Alternatively the chip 12 and L.E.D. 30 along with a portion of wire leads 44, 45 and 46 may be integrally molded or cast in a solid block of plastic or other insulating material.

A similar housing 50 contains a magnet 51 that has a particular one of the pole faces 51a (north or south) flush with a housing outer surface 52, which surface defines a plane 53. Hall element threshold detectors, such as in the above mentioned integrated circuit described in U.S. Pat. No. 3,816,766, may only operate in one polarity and thus only one of the two magnet polarities will be operable with it. The assembly 55 has a mounting flange 56 with mounting holes 57 and 58.

With reference to FIG. 4, the sensor device 36 is mounted to a machine member 60 by means of bolts 61 and 62. The plane of mounting 63 is at right angles to the plane 38 (FIG. 3) of the silicon chip 12 and thus of the Hall element 10.

When the Hall element sensor 36 is fix mounted and the relative motion of the magnet assembly 55 is in the direction indicated by arrow 70 in FIG. 3, the distance between the Hall element 11 and magnet 51 at first decreases. Upon reaching a certain distance, the magnetic field generated by the magnets at the Hall element 11 exceeds the aforementioned predetermined magnitude to trigger the threshold detector 21 and the L.E.D. 30 extinguishes. Subsequently the magnet moves away to the left (in FIG. 3) from the sensor 36, the magnetic field at the Hall element 11 falls below the predetermined magnitude and the L.E.D. 30 illuminates. A similar action occurs when the relative movement of the magnet is at right angles to that just described, namely head on. As the magnet 51 in that case approaches the sensor 36, the magnetic field strength at element 11 increases and ultimately exceeds the predetermined magnitude, extinguishing the L.E.D. 30. Alternatively the sensor 36 and magnet assembly 55 may both be fix mounted with a spacing between them that is less than the distance necessary to extinguish the L.E.D. 30; an iron vane, or other magnetic field shield material (not shown) may be caused to alternately move in and out of the space between sensor 36 and magnet assembly 55 to alternately trigger on and off the L.E.D. 30. A window in such a vane may be used to accomplish the same result, which arrangement is especially effective when the vane is caused to rotate for detecting rotational speed or for synchronizing other machine action with the angle of rotation.

What is claimed is:

1. A proximity sensor kit having two basic component parts capable of being mounted to a fixed and a movable member of a machine, respectively, for producing an electrical output signal and a visual indication when a portion of said movable member moves to within a predetermined distance with respect to a portion of said fixed member, said kit comprising the combination of said parts, namely:

(a) a two-state Hall element proximity sensor device, adapted to be mounted to said fixed member portion, comprising a Hall element and a voltage-threshold detector means being connected to the output of said Hall element for generating a particular electrical signal only when the magnetic field at said element exceeds a predetermined magnitude in a predetermined polarity; a housing containing said sensor device, the plane of said element being positioned parallel to and adjacent to an outer face of said housing; and an indicator lamp means for providing one state of illumination only when excited by said signal, said lamp means including a lamp that is connected to the output of said detector means and is attached to and protrudes from another face of said housing to be seen from many directions of viewing and to provide visual indication whether said particular electrical signal is present;

(b) a magnet adapted to be mounted to said movable member portion in such a position that when said fixed portion is within said predetermined distance, one of the poles of said magnet substantially faces said sensor, said magnet providing an ambient magnetic field at said Hall element of said predetermined polarity and of said predetermined magnitude.

2. The proximity sensor kit of claim 1 wherein said sensor device additionally includes an electrical termination means at said housing for connecting an electrical energy source to said Hall element and to said detector means and for connecting said output of said detector means to a remote voltage or current responsive device.

3. The proximity sensor kit of claim 2 wherein said termination means is comprised of three lead wires extending from a surface of said housing.

4. The proximity sensor kit of claim 1 wherein said sensor device additionally includes a mounting flange extending in a first plane from said housing, the plane of said Hall element being in a second plane that is at right angles to said first plane.

5. The proximity sensor kit of claim 1 wherein said sensor device is a silicon integrated circuit.

6. The proximity sensor kit of claim 1 wherein said lamp is a discrete light emitting diode having a translucent dome portion.

* * * * *